(12) United States Patent
Noro

(10) Patent No.: US 11,329,036 B2
(45) Date of Patent: May 10, 2022

(54) SEMICONDUCTOR MEMORY DEVICE

(71) Applicant: Kioxia Corporation, Minato-ku (JP)

(72) Inventor: Hiromi Noro, Kawasaki (JP)

(73) Assignee: Kioxia Corporation, Minato-ku (JP)

( * ) Notice: Subject to any disclaimer, the term of this patent is extended or adjusted under 35 U.S.C. 154(b) by 145 days.

(21) Appl. No.: 16/804,517

(22) Filed: Feb. 28, 2020

(65) Prior Publication Data
US 2021/0066275 A1    Mar. 4, 2021

(30) Foreign Application Priority Data

Aug. 26, 2019 (JP) .............................. JP2019-153932

(51) Int. Cl.

| | |
|---|---|
| *H01L 25/18* | (2006.01) |
| *H01L 25/065* | (2006.01) |
| *G11C 5/04* | (2006.01) |
| *G11C 5/06* | (2006.01) |
| *G11C 29/02* | (2006.01) |
| *G11C 29/50* | (2006.01) |

(52) U.S. Cl.
CPC .............. *H01L 25/18* (2013.01); *G11C 5/04* (2013.01); *G11C 5/063* (2013.01); *G11C 29/022* (2013.01); *G11C 29/028* (2013.01); *G11C 29/50008* (2013.01); *H01L 25/0657* (2013.01); *H01L 2225/06506* (2013.01); *H01L 2225/06562* (2013.01)

(58) Field of Classification Search
CPC ............. H01L 25/18; H01L 25/0657; H01L 2225/06562; H01L 2225/06506; G11C 29/022; G11C 29/50008; G11C 29/028; G11C 5/063; G11C 5/04
See application file for complete search history.

(56) References Cited

U.S. PATENT DOCUMENTS 5,987,623 A * 11/1999 Ushida ................. G11C 29/883
 714/6.1
10,454,721 B2 10/2019 Yamamoto et al.
(Continued)

FOREIGN PATENT DOCUMENTS

| JP | 2011-182378 A | 9/2011 |
|---|---|---|
| JP | 2013-098240 A | 5/2013 |
| JP | 2018-045743 A | 3/2018 |

*Primary Examiner* — Ahmed N Sefer
(74) *Attorney, Agent, or Firm* — Oblon, McClelland, Maier & Neustadt, L.L.P.

(57) ABSTRACT

According to one embodiment, a semiconductor memory device includes a mounting board and memory dies. The memory dies include first pad electrodes, first pull-up circuits connected to the first pad electrodes, a first output circuit that outputs a first parameter to the first pull-up circuits, first pull-down circuits connected to the first pad electrodes, a second output circuit that outputs a second parameter to the first pull-down circuits, a second pad electrode, a second pull-up circuit connected to the second pad electrode, a third output circuit that is connected to the second pad electrode, a third pad electrode, a second pull-down circuit connected to the third pad electrode, and a fourth output circuit that is connected to the third pad electrode. The second pad electrode of the second memory die is connected to the third pad electrode of the first memory die.

16 Claims, 13 Drawing Sheets

(56) References Cited

U.S. PATENT DOCUMENTS

| | | | | |
|---|---|---|---|---|
| 2007/0030024 | A1* | 2/2007 | Lee | G11C 7/1051 |
| | | | | 326/30 |
| 2008/0186798 | A1* | 8/2008 | Chu | H01L 25/0657 |
| | | | | 365/230.03 |
| 2011/0193590 | A1 | 8/2011 | Nakagawa et al. | |
| 2012/0080806 | A1* | 4/2012 | Song | H01L 25/0657 |
| | | | | 257/777 |
| 2013/0088838 | A1* | 4/2013 | Lee | H01L 24/48 |
| | | | | 361/728 |
| 2013/0094301 | A1* | 4/2013 | Min | C23C 14/042 |
| | | | | 365/189.02 |
| 2013/0182513 | A1* | 7/2013 | Eom | H03K 19/0005 |
| | | | | 365/189.07 |
| 2014/0002146 | A1* | 1/2014 | Kim | H03K 17/102 |
| | | | | 327/109 |
| 2014/0210108 | A1* | 7/2014 | Park | H01L 25/0657 |
| | | | | 257/777 |
| 2015/0200187 | A1* | 7/2015 | Park | H01L 25/0657 |
| | | | | 257/777 |
| 2015/0332747 | A1* | 11/2015 | Chan | G11C 8/18 |
| | | | | 365/233.1 |
| 2016/0071566 | A1* | 3/2016 | Noro | G11C 29/022 |
| | | | | 365/51 |
| 2016/0204782 | A1* | 7/2016 | Lee | H03K 19/017545 |
| | | | | 365/189.17 |
| 2017/0099050 | A1* | 4/2017 | Lee | H03K 19/0005 |
| 2018/0130739 | A1* | 5/2018 | Miura | H01L 24/02 |
| 2019/0198066 | A1* | 6/2019 | Seong | G11C 7/1048 |

* cited by examiner

FIG. 5

| | OCD Strength | | | | | | |
|---|---|---|---|---|---|---|---|
| OCD_EN<6:0> | 7F | 3F | 1F | 0F | 07 | 03 | 01 |
| $Z_{DRV}$ | 34.4 | 40 | 48 | 60 | 80 | 120 | 240 |

⟵ Output Driver Performance ⟶
High                           Low

FIG. 12

SEMICONDUCTOR MEMORY DEVICE

CROSS-REFERENCE TO RELATED APPLICATIONS

This application is based upon and claims the benefit of Japanese Patent Application No. 2019-153932, filed on Aug. 26, 2019, the entire contents of which are incorporated herein by reference.

BACKGROUND

Field

Embodiments described herein relate generally to a semiconductor memory device.

Description of the Related Art

There has been known a semiconductor memory device including a mounting board and a plurality of memory dies mounted to this mounting board.

BRIEF DESCRIPTION OF THE DRAWINGS

FIG. 5 is a schematic table illustrating an operation of the OCD circuit 15;
FIG. 12 is a schematic circuit diagram illustrating a configuration of calibration circuits 17A and 17B.

DETAILED DESCRIPTION

Figure 1:
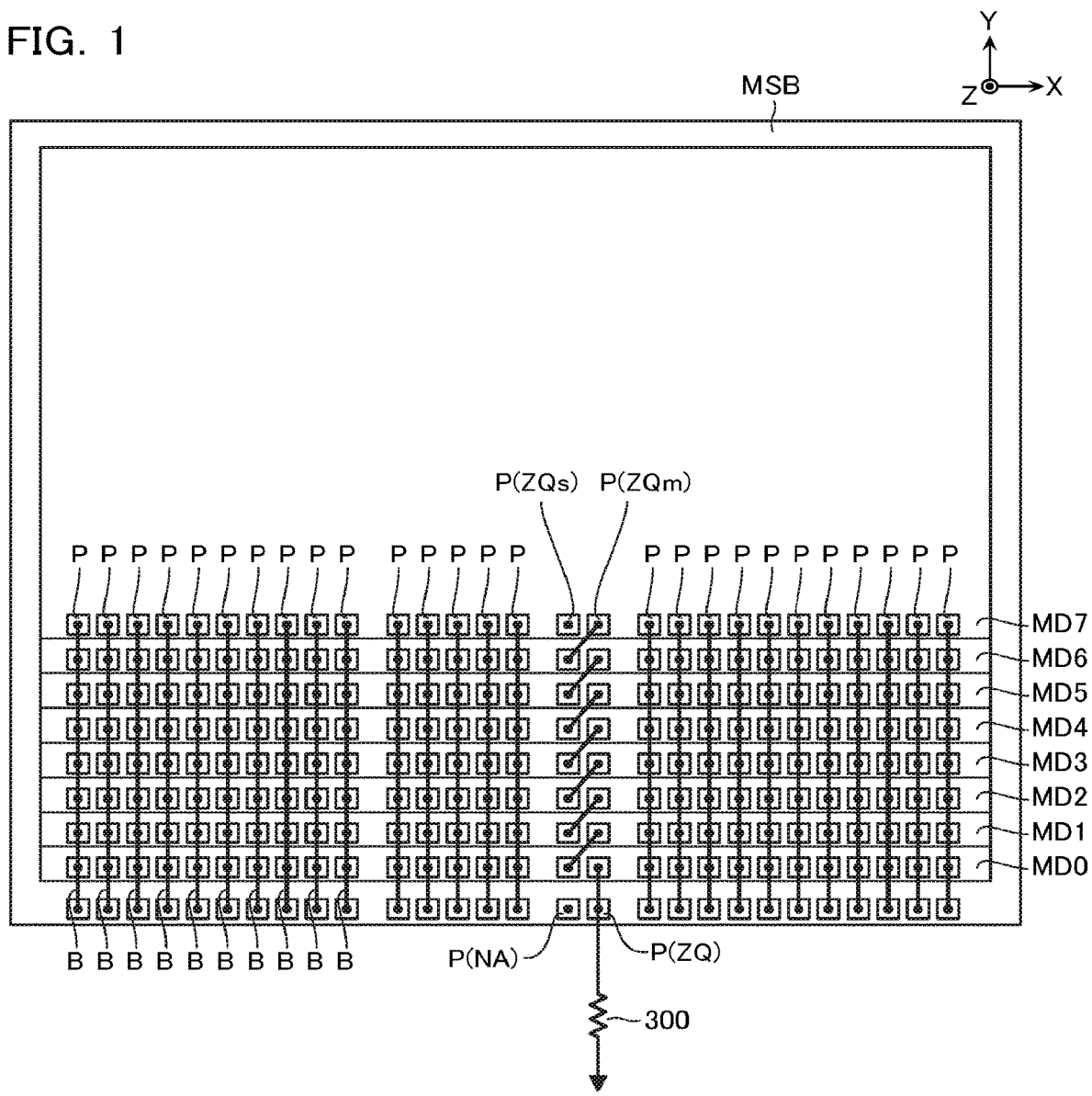
FIG. 1 is a schematic plan view illustrating a configuration of a semiconductor memory device according to a first embodiment.

A semiconductor memory device according to one embodiment includes a mounting board and a first and a second memory die mounted to the mounting board. The first and the second memory die each include a plurality of first pad electrodes, a plurality of first pull-up circuits, a first output circuit, a plurality of first pull-down circuits, and a second output circuit. The plurality of first pad electrodes are usable for inputting/outputting data. The plurality of first pull-up circuits are connected to the plurality of first pad electrodes. The first output circuit outputs a first parameter to the plurality of first pull-up circuits. The plurality of first pull-down circuits are connected to the plurality of first pad electrodes. The second output circuit outputs a second parameter to the plurality of first pull-down circuits. The first and the second memory die include a second pad electrode, a second pull-up circuit, and a third output circuit. The second pull-up circuit is connected to the second pad electrode. The third output circuit is connected to the second pad electrode. The third output circuit outputs the first parameter to the second pull-up circuit. The first and the second memory die include a third pad electrode, a second pull-down circuit, and a fourth output circuit. The second pull-down circuit is connected to the third pad electrode. The fourth output circuit is connected to the third pad electrode. The fourth output circuit outputs the second parameter to the second pull-down circuit. The second pad electrode of the second memory die is connected to the third pad electrode of the first memory die.

A semiconductor memory device according to one embodiment includes a mounting board and a first and a second memory die mounted to the mounting board. The first and the second memory die each include a plurality of first pad electrodes, a second pad electrode, a third pad electrode, and an input/output control circuit. The plurality of first pad electrodes is usable for inputting/outputting data. The input/output control circuit is connected to the plurality of first pad electrodes, the second pad electrode, and the third pad electrode. The second pad electrode of the second memory die is connected to the third pad electrode of the first memory die. A voltage of the second pad electrode of the first memory die fluctuates from a first timing to a second timing after the first timing. Voltages of the third pad electrode of the first memory die and the second pad electrode of the second memory die fluctuate from the first timing or a third timing after the first timing to a fourth timing after the second timing and the third timing. A voltage of the third pad electrode of the second memory die fluctuates from a fifth timing after the second timing and the third timing to a sixth timing after the fourth timing and the fifth timing.

Next, semiconductor memory devices according to embodiments will be described in detail with reference to the drawings. The following embodiments are merely examples, and will not be described for the purpose of limiting the present invention.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even if the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

First Embodiment

Overall Configuration

Figure 2:
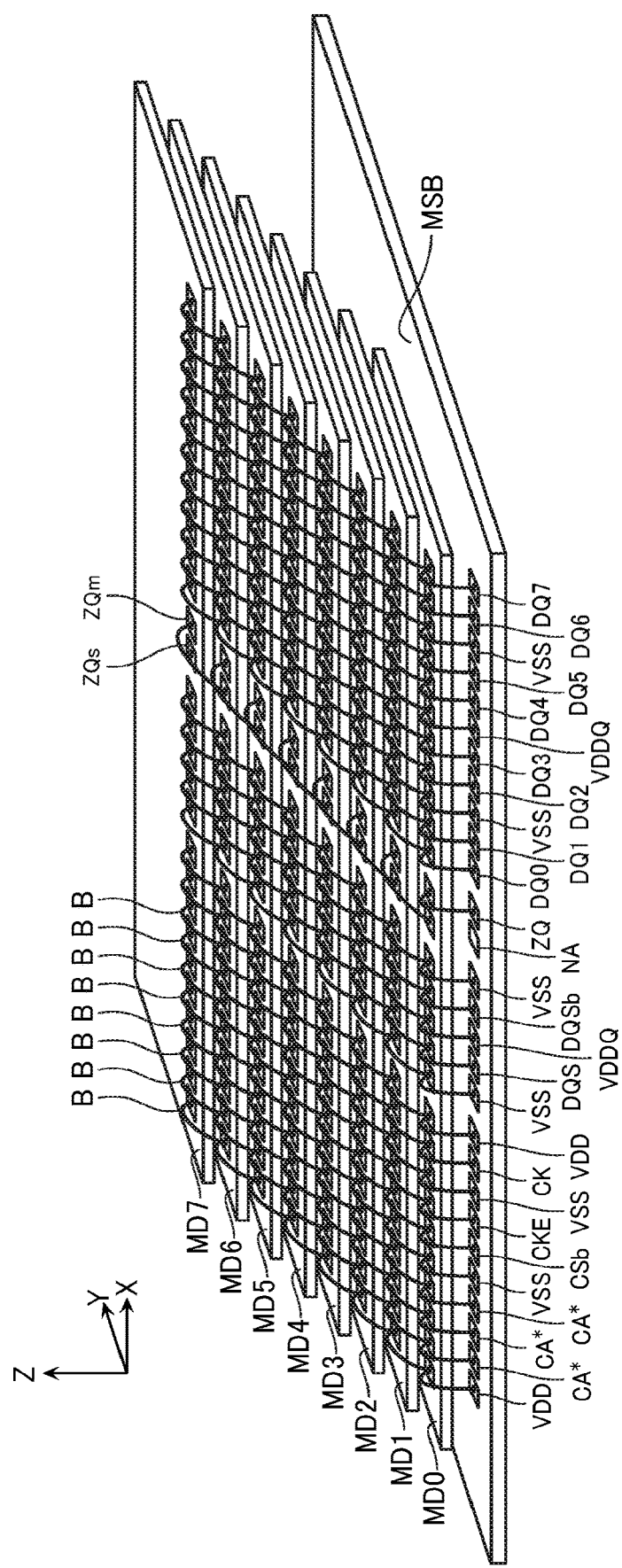
FIG. 2 is a schematic perspective view of the same semiconductor memory device.

FIG. 1 is a schematic plan view illustrating a configuration of a semiconductor memory device according to a first embodiment. FIG. 2 is a schematic perspective view illustrating the configuration of the same semiconductor memory device.

The semiconductor memory device according to the embodiment includes a mounting board MSB and a plurality of memory dies MD0 to MD7 laminated on the mounting board MSB. These configurations are laminated by being shifted in a Y direction so as to expose pad electrodes P formed on upper surfaces, and connected to one another via an adhesive or the like.

The mounting board MSB and the plurality of memory dies MD0 to MD7 each include the plurality of pad electrodes P as illustrated in FIG. 1. The plurality of pad electrodes P disposed on the mounting board MSB and the plurality of memory dies MD0 to MD7 are each connected to one another via bonding wires B.

The plurality of pad electrodes P, as illustrated in FIG. 2, include power supply voltage supply electrodes VSS, VDD, and VDDQ that supply power supply voltages to the memory dies MD0 to MD7, data transmitting and receiving electrodes DQ0 to DQ7, DQS, and DQSb that are usable for transmitting and receiving data of the memory dies MD0 to MD7, and control electrodes CA, CSb, CKE, and CK usable for controlling the memory dies MD0 to MD7. Note that, in the illustrated example, the mounting board MSB and the plurality of memory dies MD0 to MD7 each include six power supply voltage supply electrodes VSS. As illustrated in FIG. 1, the bonding wires B connected to the plurality of these pad electrodes P each extend in the Y direction viewing from a Z direction.

The mounting board MSB includes a calibration electrode ZQ usable when output impedance of the above-described data transmitting and receiving electrodes DQ0 to DQ7 is adjusted. The plurality of memory dies MD each include calibration electrodes ZQm and ZQs. The calibration electrodes ZQm and ZQs are two pad electrodes P adjacent to one another among the plurality of pad electrodes P aligned in an X direction. The calibration electrode ZQm of the memory die MD0 at the first memory die counted from the mounting board MSB is connected to the power supply voltage supply electrodes VSS outside the semiconductor memory device via the calibration electrode ZQ of the mounting board MSB and a serial resistor 300 having a resistance value of approximately 240Ω. The calibration electrode ZQm of the memory die MD1 at the second memory die counted from the mounting board MSB is connected to the calibration electrode ZQs of the memory die MD0. The calibration electrode ZQm of the memory die MD2 at the third memory die counted from the mounting board MSB is connected to the calibration electrode ZQs of the memory die MD1. Similarly, the calibration electrodes ZQm of the respective memory dies MD3 to MD7 are connected to the calibration electrodes ZQs of the memory dies MD2 to MD6 immediately below. Note that the bonding wires B connected to the calibration electrodes ZQm and ZQs of the respective memory dies MD0 to MD7 extend in the diagonal direction (the direction between the X direction and the Y direction) viewing from the Z direction.

Note that, in the following description, the memory dies MD0 to MD7 are simply referred to as "the memory die MD" in some cases.

Figure 3:
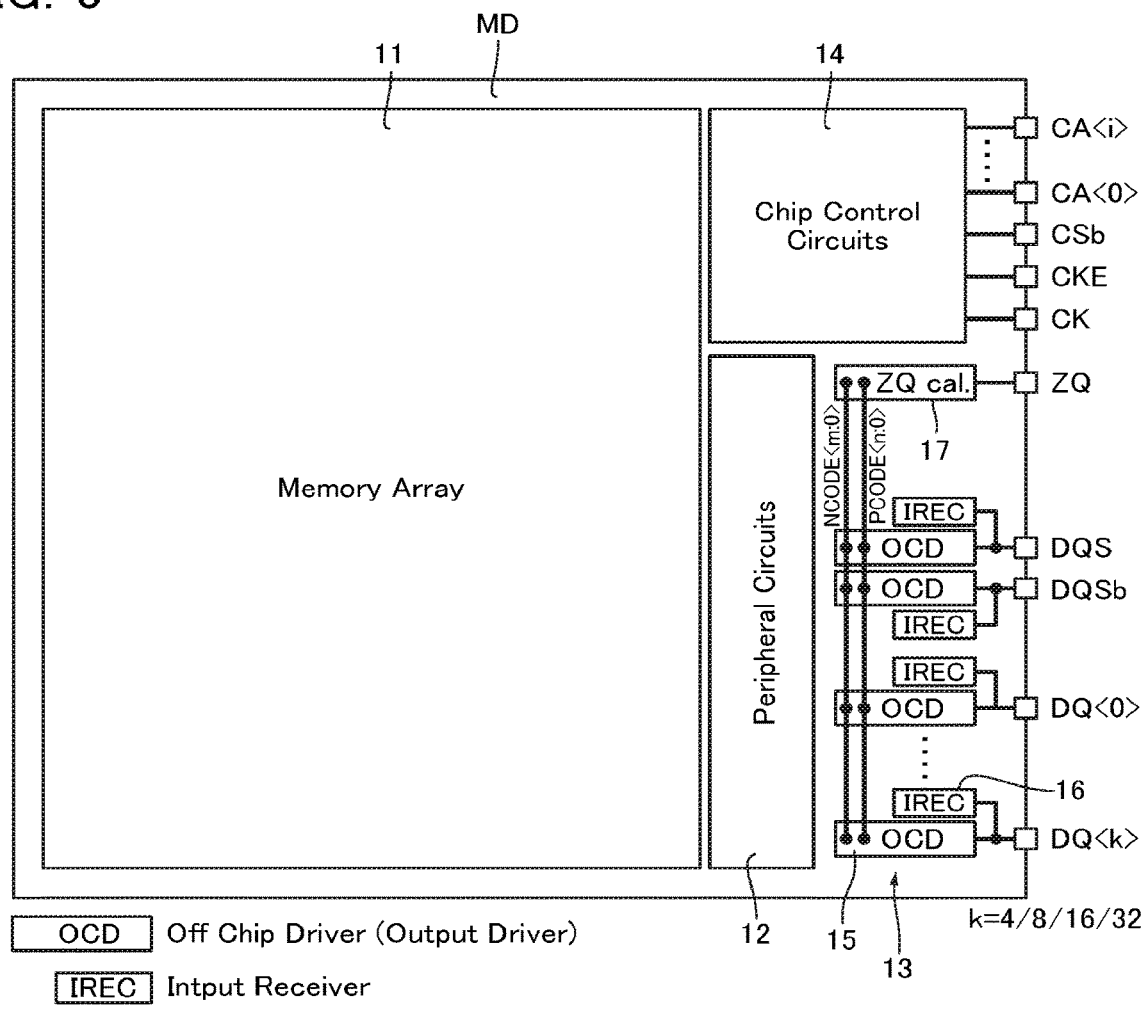
FIG. 3 is a schematic block diagram illustrating a configuration of a memory die MD.

FIG. 3 is a schematic block diagram illustrating a configuration of the memory die MD according to the first embodiment.

As illustrated in FIG. 3, the memory die MD includes a memory cell array 11 that stores data, a peripheral circuit 12 that controls the memory cell array 11, an input/output control circuit 13 that inputs and outputs data, and a chip control circuit 14 that controls the input/output control circuit 13.

The memory cell array 11 includes a plurality of memory cells. The plurality of these memory cells store data having one bit or a plurality of bits. Various kinds of configurations are applicable to the memory cell array. For example, the memory cell array may be one that includes a memory transistor including any memory films, including an electric charge accumulating film or a ferroelectric film, for a gate insulating film. The memory cell array may be a phase change memory that includes a chalcogenide film, such as GeSbTe, and in which a crystal state of the chalcogenide film changes corresponding to a write operation. The memory cell array may be an MRAM that includes a pair of ferromagnetic films in opposing orientation and a tunnel insulating film disposed between these ferromagnetic films, and in which the magnetizing direction of the above-described ferromagnetic film changes corresponding to a write operation. The memory cell array may be a ReRAM that includes a pair of electrodes and a metal oxide and the like disposed between these electrodes, and in which the above-described electrodes electrically conduct via, for example, filament of oxygen vacancies and the like corresponding to a write operation. The memory cell array may be a DRAM that includes a capacitor and a transistor, and charges to and discharges from the capacitor in a write operation and a read operation. The memory cell array may have another configuration.

The peripheral circuit 12 includes, a voltage generation circuit, a voltage transfer circuit, a sense amplifier circuit, and a sequencer. The voltage generation circuit is, for example, connected to the above-described power supply voltage supply electrodes VSS, VDD, and VDDQ to generate a voltage necessary for controlling the memory cell array 11. The voltage transfer circuit transfers the generated voltage to a desired wiring in the memory cell array 11 corresponding to address data. The sense amplifier circuit determines data recorded in a memory cell corresponding to a voltage or a current of the wiring in the memory cell array 11. The sequencer controls these circuits corresponding to command data. The peripheral circuit 12 includes, for example, a cache memory that latches read data and write data, an address register that latches address data, and a command register that latches command data.

The input/output control circuit 13 includes the data transmitting and receiving electrodes DQ0 to DQ7, DQS, and DQSb, Off Chip Driver (OCD) circuits 15 and data receiving circuits 16 connected to each of these data transmitting and receiving electrodes DQ0 to DQ7, DQS, and DQSb, and a calibration circuit 17. The input/output control circuit 13 includes a FIFO buffer and a shift register that transfer data between the OCD circuit 15 and data receiving circuit 16, and the cache memory, address register and command register in the peripheral circuit 12. The data received via the data transmitting and receiving electrodes DQ0 to DQ7 and the data receiving circuit 16 is transferred to the cache memory, the address register, or the command register corresponding to a control signal from the chip control circuit 14. The data transmitted via the data transmitting and receiving electrodes DQ0 to DQ7 and the OCD circuit 15 is transferred from the cache memory corresponding to a control signal from the chip control circuit 14.

The chip control circuit 14 receives the control signal from outside via the control electrodes CA, CSb, CKE, and CK, and controls the input/output control circuit 13 corresponding to this.

OCD Circuit 15

Figure 4:
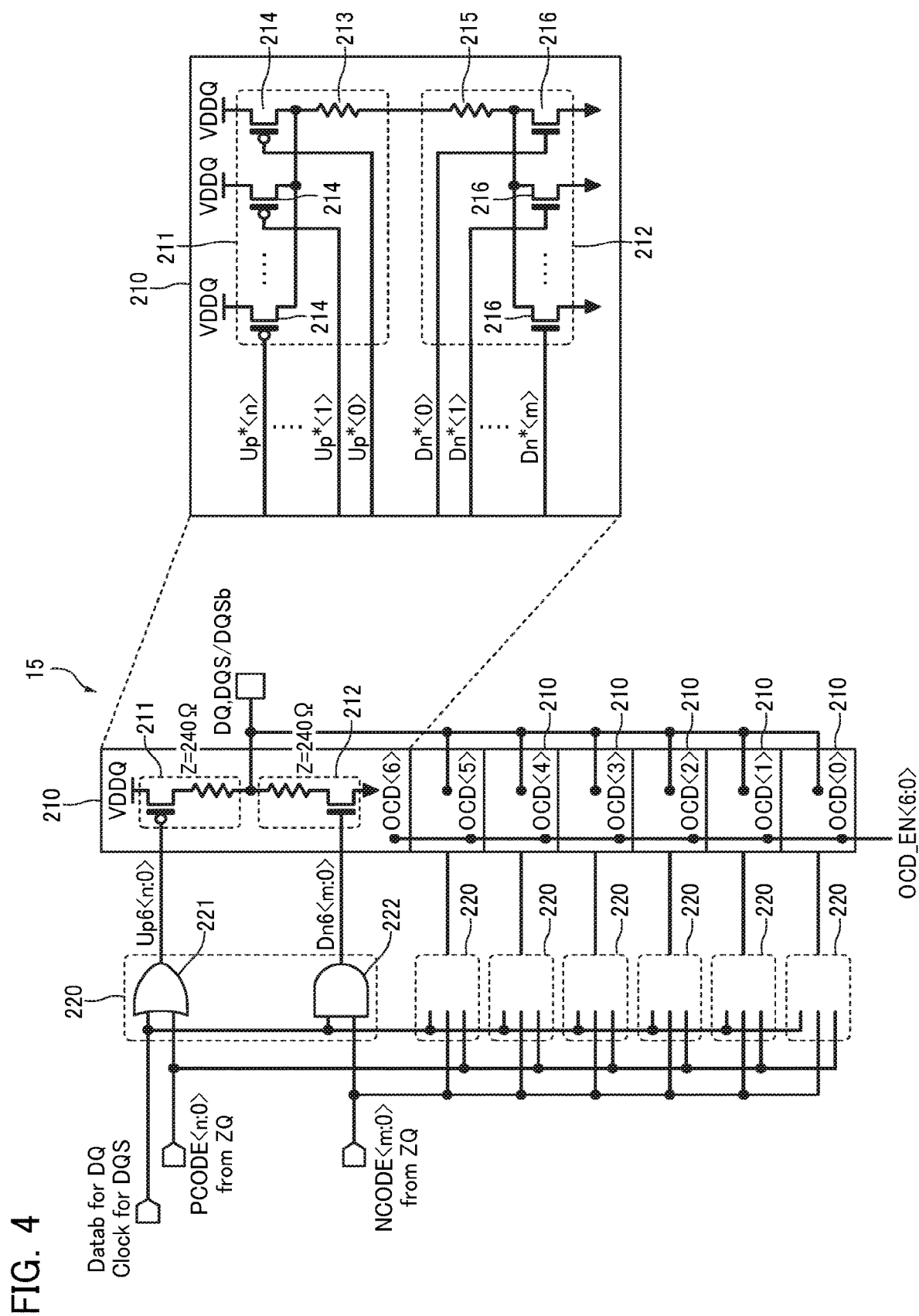
FIG. 4 is a schematic circuit diagram illustrating a configuration of an OCD circuit 15.

FIG. 4 is a schematic circuit diagram illustrating a configuration of the OCD circuit 15.

The OCD circuit 15 adjusts the output impedance when data is transmitted from each of the memory dies MD to the mounting board MSB.

The OCD circuit 15 includes seven OCD units 210 connected to the data transmitting and receiving electrodes DQ0 to DQ7, DQS, and DQSb in parallel and seven OCD unit control circuits 220 connected to these seven OCD units 210.

The seven OCD units 210 each have an impedance of 240Ω. The seven OCD units 210 are each connected to a signal line OCD_EN<6:0>, and the number of the OCD unit 210 that is driven is controlled corresponding to the signal line OCD_EN<6:0>. For example, when a signal 0000001 (01 in hexadecimal) is input into the signal line OCD_EN<6:0>, as illustrated in FIG. 5, an impedance $Z_{DRV}$ of the OCD circuit 15 is set to approximately 240Ω. For example, when a signal 0011111 (1F in hexadecimal) is input into the signal line OCD_EN<6:0>, the impedance $Z_{DRV}$ of the OCD circuit 15 is set to approximately 240 Ω/5=48Ω. The signal of the signal line OCD_EN<6:0> is, for example, controlled by a user.

The OCD units 210 include, for example, as illustrated in FIG. 4, respective pull-up circuits 211 connected between the power supply voltage supply electrodes VDDQ and the data transmitting and receiving electrodes DQ0 to DQ7, DQS, and DQSb. The OCD units 210 include respective pull-down circuits 212 connected between the data transmitting and receiving electrodes DQ0 to DQ7, DQS, and DQSb, and the power supply voltage supply electrodes VSS.

The pull-up circuit 211 includes a resistive element 213 connected to the data transmitting and receiving electrodes DQ0 to DQ7, DQS, or DQSb, and n+1 (n is a natural number) transistors 214 connected in parallel between the resistive element 213 and the power supply voltage supply electrodes VDDQ. The transistor 214 is a PMOS transistor. The n+1 transistors 214 include at least one of respectively different channel widths and channel lengths, and have different resistance values of n+1 ways. The n+1 transistors 214 have gate electrodes connected to respective signal lines Up*<0> to Up*<n> (* is any one of 0 to 6). Data of n+1 bits input to the signal line Up*<0> to Up*<n> is adjusted such that the impedance when the pull-up circuit 211 is driven becomes approximately 240Ω.

The pull-down circuit 212 includes a resistive element 215 connected to the data transmitting and receiving electrodes DQ0 to DQ7, DQS, and DQSb, and m+1 (m is a natural number) transistors 216 connected in parallel between the resistive element 215 and the power supply voltage supply electrodes VSS. The transistor 216 is an NMOS transistor. The m+1 transistors 216 include at least one of respectively different channel widths and channel lengths, and have different resistance values of m+1 ways. The m+1 transistors 216 have gate electrodes connected to respective signal lines Dn*<0> to Dn*<m> (* is any one of 0 to 6). Data of in +1 bits input to the signal line Dn*<0> to Dn*<m> is adjusted such that the impedance when the pull-down circuit 212 is driven becomes approximately 240Ω.

The OCD unit control circuit 220 includes, for example, n+1 OR circuits 221 and m+1 AND circuits 222.

Each of the n+1 OR circuits 221 has one input terminal to which a signal of "1" or "0" output from the data transmitting and receiving electrodes DQ0 to DQ7 or a clock signal output from the data transmitting and receiving electrodes DQS and DQSb is input. Each of the n+1 OR circuits 221 has the other input terminal to which a corresponding bit among data PCODE<n:0> (a first parameter) of n+1 bits that corresponds to n+1 of the PMOS transistors included in the pull-up circuit 211 is input.

Each of the m+1 AND circuits 222 has one input terminal to which a signal of "1" or "0" output from the data transmitting and receiving electrodes DQ0 to DQ7 or a clock signal output from the data transmitting and receiving electrodes DQS and DQSb is input. Each of the m+1 AND circuits 222 has the other input terminal to which a corresponding bit among data NCODE<m:0> (a second parameter) of m+1 bits that corresponds to m+1 of the NMOS transistors included in the pull-down circuit 212 is input.

Calibration Circuit 17

Figure 6:
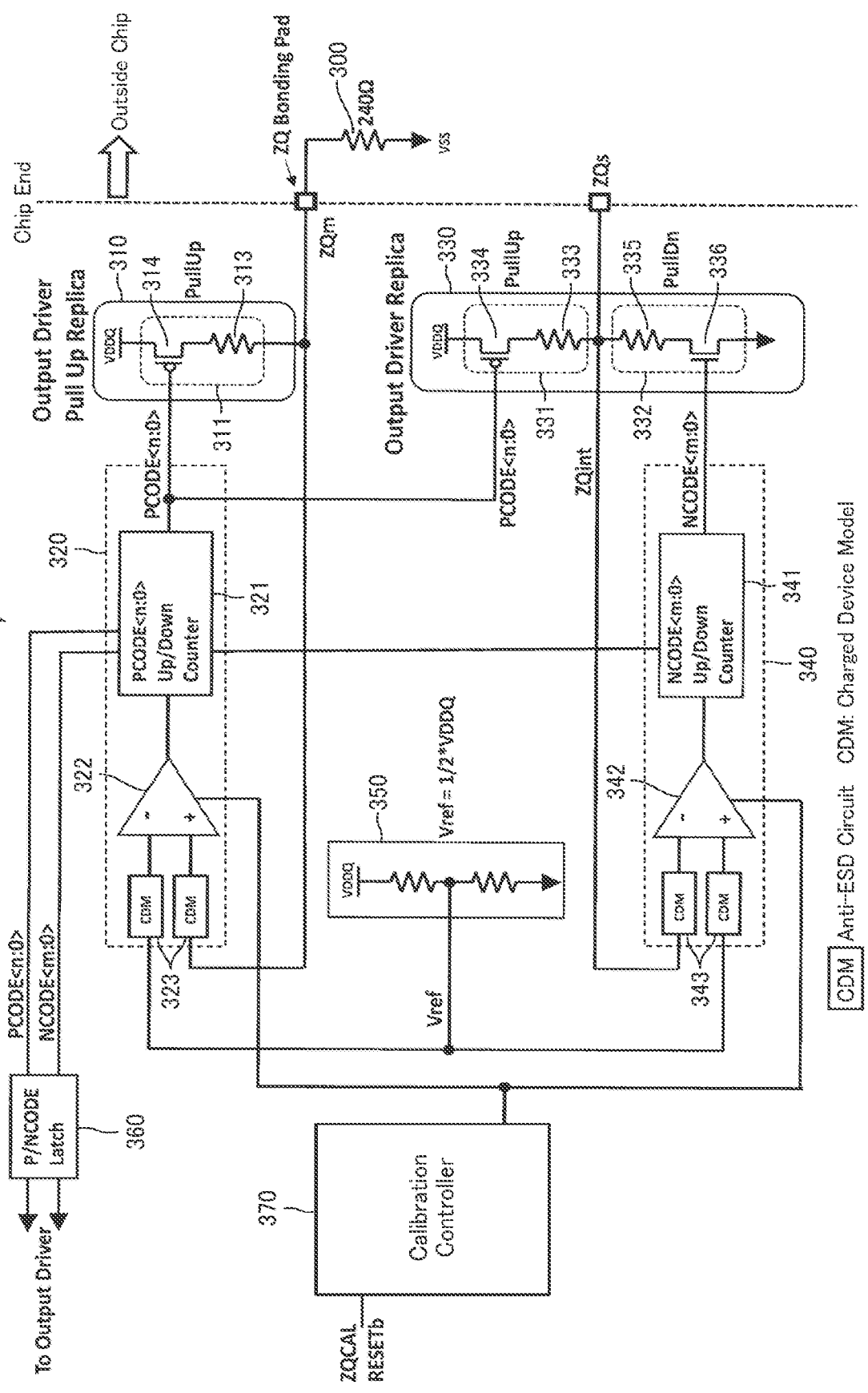
FIG. 6 is a schematic circuit diagram illustrating a configuration of a calibration circuit 17.
Figure 7:
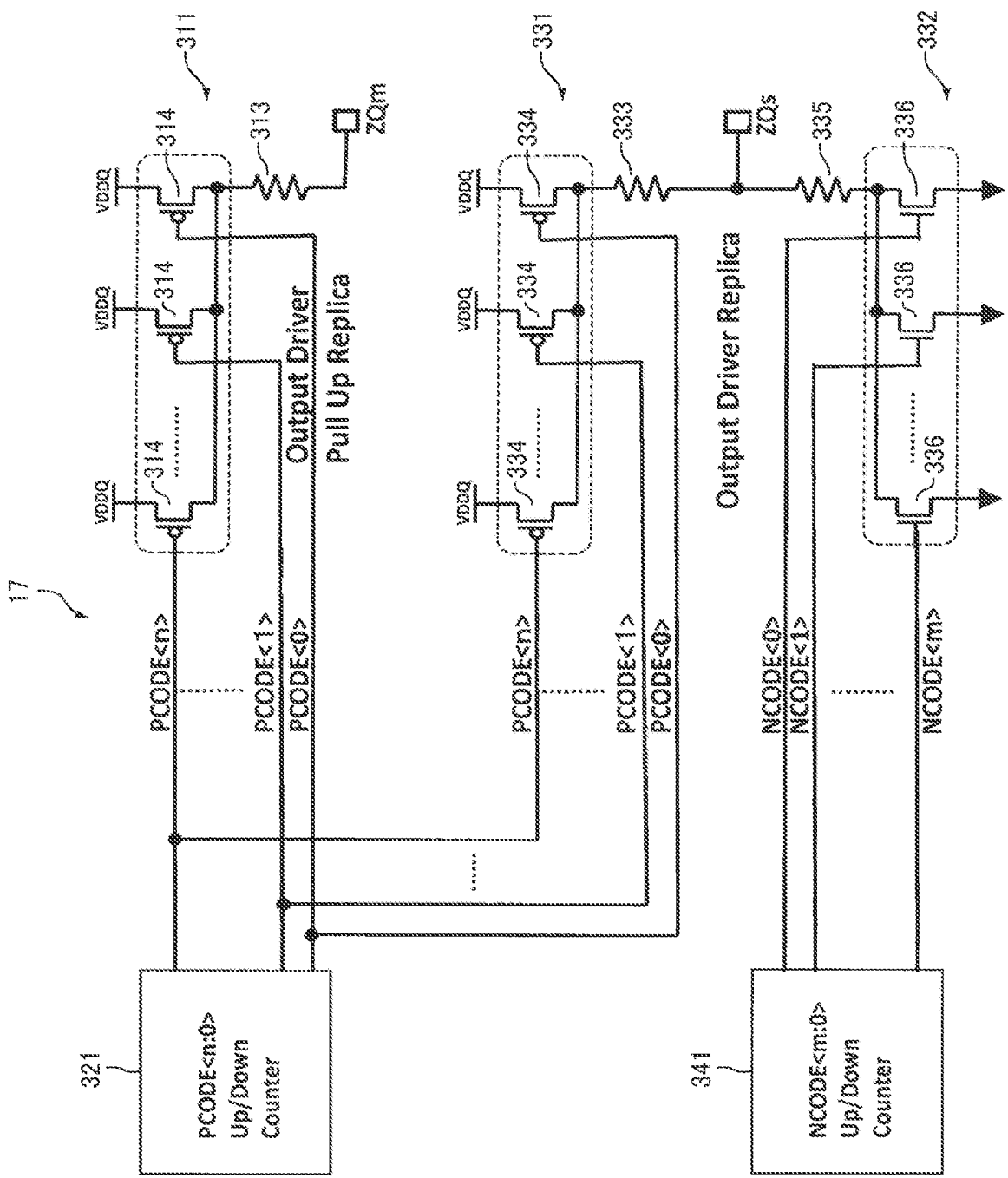
FIG. 7 is a schematic circuit diagram illustrating a configuration of the calibration circuit 17.

FIG. 6 and FIG. 7 are schematic circuit diagrams illustrating a configuration of the calibration circuit 17.

The calibration circuit 17 adjusts the data PCODE<n:0> and the data NCODE<m:0> so that the impedance when the above-described pull-up circuit 211 is driven and the impedance when the above-described pull-down circuit 212 is driven become approximately 240Ω.

The calibration circuit 17 includes, as illustrated in FIG. 6, a first replica unit 310, a first replica unit control circuit 320, a second replica unit 330, a second replica unit control circuit 340, a reference voltage generation circuit 350, a data latch circuit 360, and a calibration control circuit 370. The first replica unit 310 is connected to the calibration electrode ZQm. The first replica unit control circuit 320 is connected to the first replica unit 310. The second replica unit 330 is connected to the calibration electrode ZQs. The second replica unit control circuit 340 is connected to the second replica unit 330.

The first replica unit 310 includes a pull-up circuit 311 connected between the power supply voltage supply electrode VDDQ and the calibration electrode ZQm.

The pull-up circuit 311 includes, as illustrated in FIG. 7, a resistive element 313 connected to the calibration electrode ZQm and n+1 transistors 314 connected in parallel between the resistive element 313 and the power supply voltage supply electrodes VDDQ. The transistor 314 is a PMOS transistor. The n+1 transistors 314 include at least one of respectively different channel widths and channel lengths, and have different resistance values of n+1 ways. The n+1 transistors 314 have gate electrodes connected to n+1 of respective signal lines. The data PCODE<n:0> is input to these n+1 signal lines.

The first replica unit control circuit 320 includes, as illustrated in FIG. 6, a counter 321, a comparator 322, and anti-ESD circuits 323. The counter 321 outputs the data PCODE<n:0>. The comparator 322 controls the counter 321. The anti-ESD circuit 323 is connected to an input terminal of the comparator 322.

The counter 321 adjusts the data PCODE<n:0> by synchronizing with the clock signal. For example, when the output signal of the comparator 322 is in "L" state, the counter 321 subtracts 1 from a value indicated by the data PCODE<n:0> of n+1 bits. The counter 321 adds 1 to the value indicated by the data PCODE<n:0> of n+1 bits when the output signal of the comparator 322 is in "H" state.

The comparator 322 has an inverting input terminal connected to the reference voltage generation circuit 350 via the anti-ESD circuit 323. The comparator 322 has a non-inverting input terminal connected to the calibration electrode ZQm via the anti-ESD circuit 323. The comparator 322 is controlled by the calibration control circuit 370.

The anti-ESD circuit 323 protects the comparator 322 from rapid charging and discharging caused by, for example, static electricity.

The second replica unit 330 includes a pull-up circuit 331 connected between the power supply voltage supply electrode VDDQ and the calibration electrode ZQs. The second replica unit 330 includes a pull-down circuit 332 connected between the calibration electrode ZQs and the power supply voltage supply electrode VSS.

The pull-up circuit 331 includes, as illustrated in FIG. 7, a resistive element 333 connected to the calibration electrode ZQs and n+1 transistors 334 connected in parallel between the resistive element 333 and the power supply voltage supply electrode VDDQ. The transistor 334 is a PMOS transistor. The n+1 transistors 334 include at least one of respectively different channel widths and channel lengths, and have different resistance values of n+1 ways. The n+1 transistors 334 have gate electrodes connected to n+1 of respective signal lines. The data PCODE<n:0> is input to these n+1 signal lines.

The pull-down circuit 332 includes, as illustrated in FIG. 7, a resistive element 335 connected to the calibration electrode ZQm and m+1 transistors 336 connected in parallel between the resistive element 335 and the power supply voltage supply electrodes VSS. The transistor 336 is a NMOS transistor. The m+1 transistors 336 include at least one of respectively different channel widths and channel lengths, and have different resistance values of m+1 ways. The m+1 transistors 336 have gate electrodes connected to m+1 of respective signal lines. The data NCODE<m:0> is input to these m+1 signal lines.

The second replica unit control circuit 340 includes, as illustrated in FIG. 6, a counter 341, a comparator 342, and anti-ESD circuits 343. The counter 341 outputs the data NCODE<m:0>. The comparator 342 controls the counter 341. The anti-ESD circuit 343 is connected to an input terminal of the comparator 342.

The counter 341 adjusts the data NCODE<m:0> by synchronizing with the clock signal. For example, when the output signal of the comparator 342 is in "L" state, the counter 341 adds 1 to a value indicated by the data NCODE<m:0> of m+1 bits. The counter 341 subtracts 1 from the value indicated by the data NCODE<m:0> of m+1 bits when the output signal of the comparator 342 is in "H" state.

The comparator 342 has an inverting input terminal connected to the reference voltage generation circuit 350 via the anti-ESD circuit 343. The comparator 342 has a non-inverting input terminal connected to the calibration electrode ZQs via the anti-ESD circuit 343. The comparator 342 is controlled by the calibration control circuit 370.

The anti-ESD circuit 343 protects the comparator 342 from rapid charging and discharging caused by, for example, static electricity.

The reference voltage generation circuit 350 includes, for example, a voltage dividing circuit. The voltage dividing circuit includes two resistive elements connected in series between the power supply voltage supply electrodes VDDQ and VSS and an output terminal connected between these two resistive elements. The two resistive elements have same resistance values and the voltage of the output terminal is half a voltage of the voltage of the power supply voltage supply electrode VDDQ.

The data latch circuit 360 latches the PCODE<n:0> output from the first replica unit control circuit 320 and the NCODE<m:0> output from the second replica unit control circuit 340, and outputs them to the OCD circuit 15.

The calibration control circuit 370 controls the first replica unit control circuit 320 and the second replica unit control circuit 340. For example, the calibration control circuit 370 controls the first replica unit control circuit 320 to adjust the PCODE<n:0>, and subsequently controls the second replica unit control circuit 340 to adjust the NCODE<m:0>.

Calibration Operation

Next, with reference to FIGS. 8A to 8C, a calibration operation of the semiconductor memory device according to the embodiment will be described.

Figure 8A:
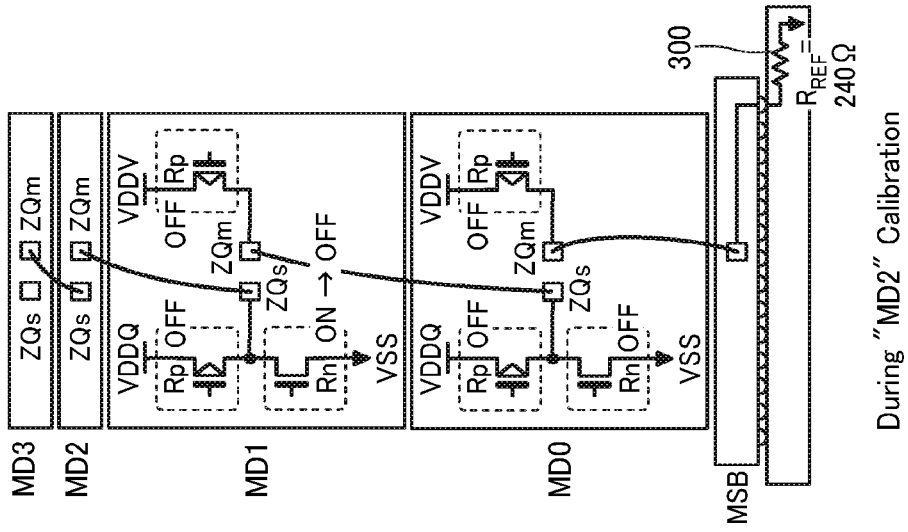
FIGS. 8A to 8C are schematic drawings for describing a calibration operation.

In the calibration operation of the semiconductor memory device according to the embodiment, for example, as illustrated in FIG. 8A, the first replica unit control circuit 320 of the memory die MD0 is controlled to adjust the data PCODE<n:0>. Here, the calibration electrode ZQm of the memory die MD0 is connected to the power supply voltage supply electrode VDDQ via the pull-up circuit 311, and is connected to the power supply voltage supply electrode VSS outside the semiconductor memory device via the serial resistor 300 having a resistance value of approximately 240Ω. Controlling the first replica unit control circuit 320 adjusts the data PCODE<n:0> such that the voltage of the calibration electrode ZQm of the memory die MD0 becomes approximately a reference voltage (½ VDDQ). This adjusts the data PCODE<n:0> such that the impedance when the pull-up circuit 311 is driven becomes approximately 240Ω. Afterwards, the first replica unit control circuit 320 of the memory die MD0 outputs the data PCODE<n:0> after the adjustment.

Note that, at a timing where the adjustment of the data PCODE<n:0> of the memory die MD0 starts, a fluctuation of the voltage of the calibration electrode ZQm of the memory die MD0 starts. At this timing, fluctuations of the voltages of the calibration electrode ZQs of the memory die MD0 and the calibration electrode ZQm of the memory die MD1 also start in some cases. At a timing where the adjustment of the data PCODE<n:0> of the memory die MD0 terminates, the fluctuation of the voltage of the calibration electrode ZQm of the memory die MD0 also terminates.

Next, for example, as illustrated in FIG. 8A, the second replica unit control circuit 340 of the memory die MD0 is controlled to adjust the data NCODE<m:0> of the memory die MD0. Here, the calibration electrode ZQs of the memory die MD0 is connected to the power supply voltage supply electrode VDDQ via the pull-up circuit 331, and is connected to the power supply voltage supply electrode VSS via the pull-down circuit 332. The impedance of the pull-up circuit 331 is adjusted to be approximately 240Ω. Controlling the second replica unit control circuit 340 adjusts the data NCODE<m:0> such that the voltage of the calibration electrode ZQs of the memory die MD0 becomes approximately the reference voltage (½ VDDQ). This adjusts the data NCODE<m:0> such that the impedance when the pull-down circuit 332 is driven becomes approximately 240Ω. Afterwards, the first replica unit control circuit 320 of the memory die MD0 causes the first replica unit 310 to be in an OFF state. The second replica unit control circuit 340 of the memory die MD0 outputs the data NCODE<m:0> after the adjustment.

Note that, when the data NCODE<m:0> of the memory die MD0 is adjusted, not only the voltage of the calibration electrode ZQs of the memory die MD0, but also the voltage of the calibration electrode ZQm of the memory die MD1 fluctuates.

Figure 8B:
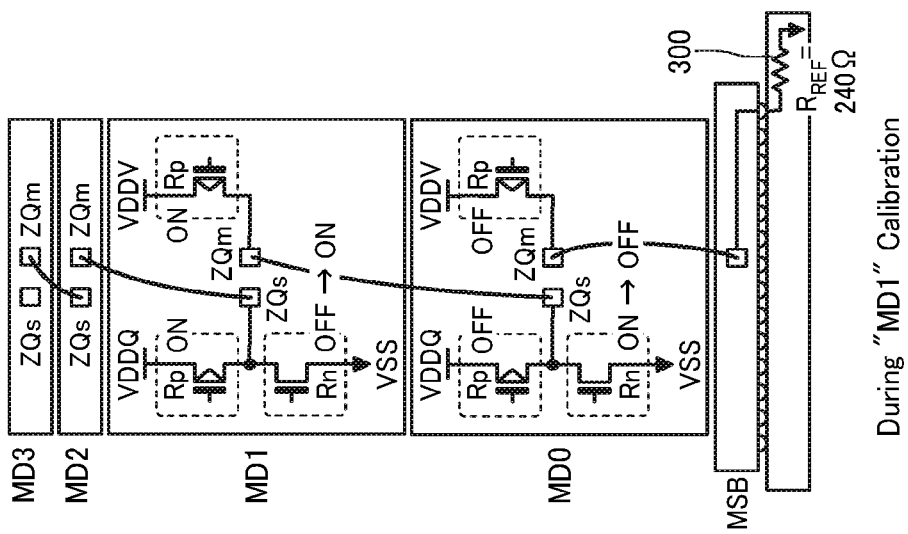
Figure 8C:
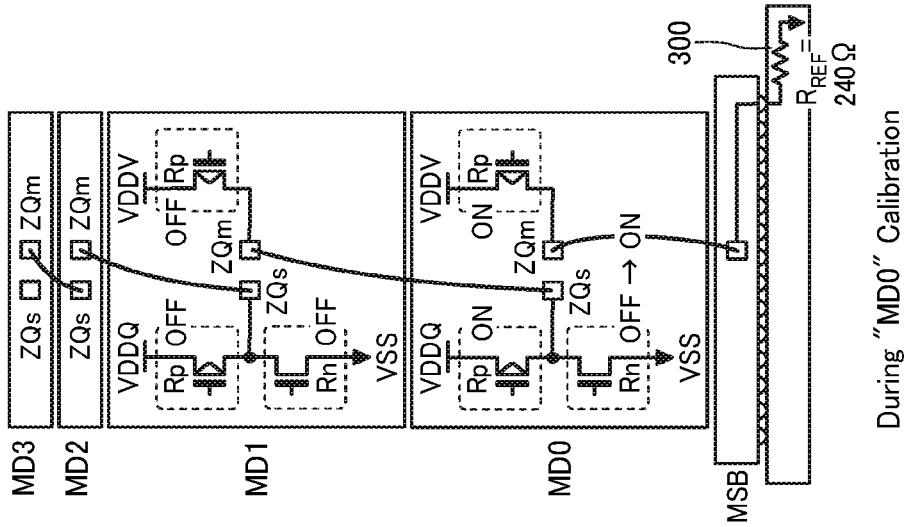

Next, for example, as illustrated in FIG. 8B, the first replica unit control circuit 320 of the memory die MD1 is controlled to adjust the data PCODE<n:0>. Here, the calibration electrode ZQm of the memory die MD1 is connected to the power supply voltage supply electrodes VDDQ via the pull-up circuit 311, and is connected to the power supply voltage supply electrode VSS via the pull-down circuit 332 of the memory die MD0. The impedance of the pull-down circuit 332 of the memory die MD0 is adjusted to be approximately 240Ω. Controlling the first replica unit control circuit 320 adjusts the data PCODE<n:0> such that the voltage of the calibration electrode ZQm of the memory die MD1 becomes approximately the reference voltage (½ VDDQ). This adjusts the data PCODE<n:0> such that the impedance when the pull-up circuit 311 is driven becomes approximately 240Ω. Afterwards, the second replica unit control circuit 340 of the memory die MD0 causes the second replica unit 330 of the memory die MD0 to be in the OFF state. The first replica unit control circuit 320 of the memory die MD1 outputs the data PCODE<n:0> after the adjustment.

Note that, when the data PCODE<n:0> of the memory die MD1 is adjusted, not only the voltage of the calibration electrode ZQm of the memory die MD1, but also the voltage of the calibration electrode ZQs of the memory die MD0 fluctuates. At a timing where the adjustment of the data PCODE<n:0> of the memory die MD1 starts, fluctuations of the voltages of the calibration electrode ZQs of the memory die MD1 and the calibration electrode ZQm of the memory die MD2 start in some cases. At a timing where the adjustment of the data PCODE<n:0> of the memory die MD1 terminates, the fluctuations of the voltages of the calibration electrode ZQm of the memory die MD1 and the calibration electrode ZQs of the memory die MD0 also terminate.

Next, for example, as illustrated in FIG. 8B, the second replica unit control circuit 340 of the memory die MD1 is controlled to adjust the data NCODE<m:0> of the memory die MD1. Here, the calibration electrode ZQs of the memory die MD1 is connected to the power supply voltage supply electrode VDDQ via the pull-up circuit 331, and is connected to the power supply voltage supply electrode VSS via the pull-down circuit 332. The impedance of the pull-up circuit 331 is adjusted to be approximately 240Ω. Controlling the second replica unit control circuit 340 adjusts the data NCODE<m:0> such that the voltage of the calibration electrode ZQs of the memory die MD1 becomes approximately the reference voltage (½ VDDQ). This adjusts the data NCODE<m:0> such that the impedance when the pull-down circuit 332 is driven becomes approximately 240Ω. Afterwards, the first replica unit control circuit 320 of the memory die MD1 causes the first replica unit 310 to be in the OFF state. The second replica unit control circuit 340 of the memory die MD1 outputs the data NCODE<m:0> after the adjustment.

Note that, when the data NCODE<m:0> of the memory die MD1 is adjusted, not only the voltage of the calibration electrode ZQs of the memory die MD1, but also the calibration electrode ZQm of the memory die MD2 fluctuates.

Similarly, the data PCODE<n:0> and the data NCODE<m:0> are sequentially adjusted for the memory dies MD2 to MD7.

Comparative Example

Figure 9:
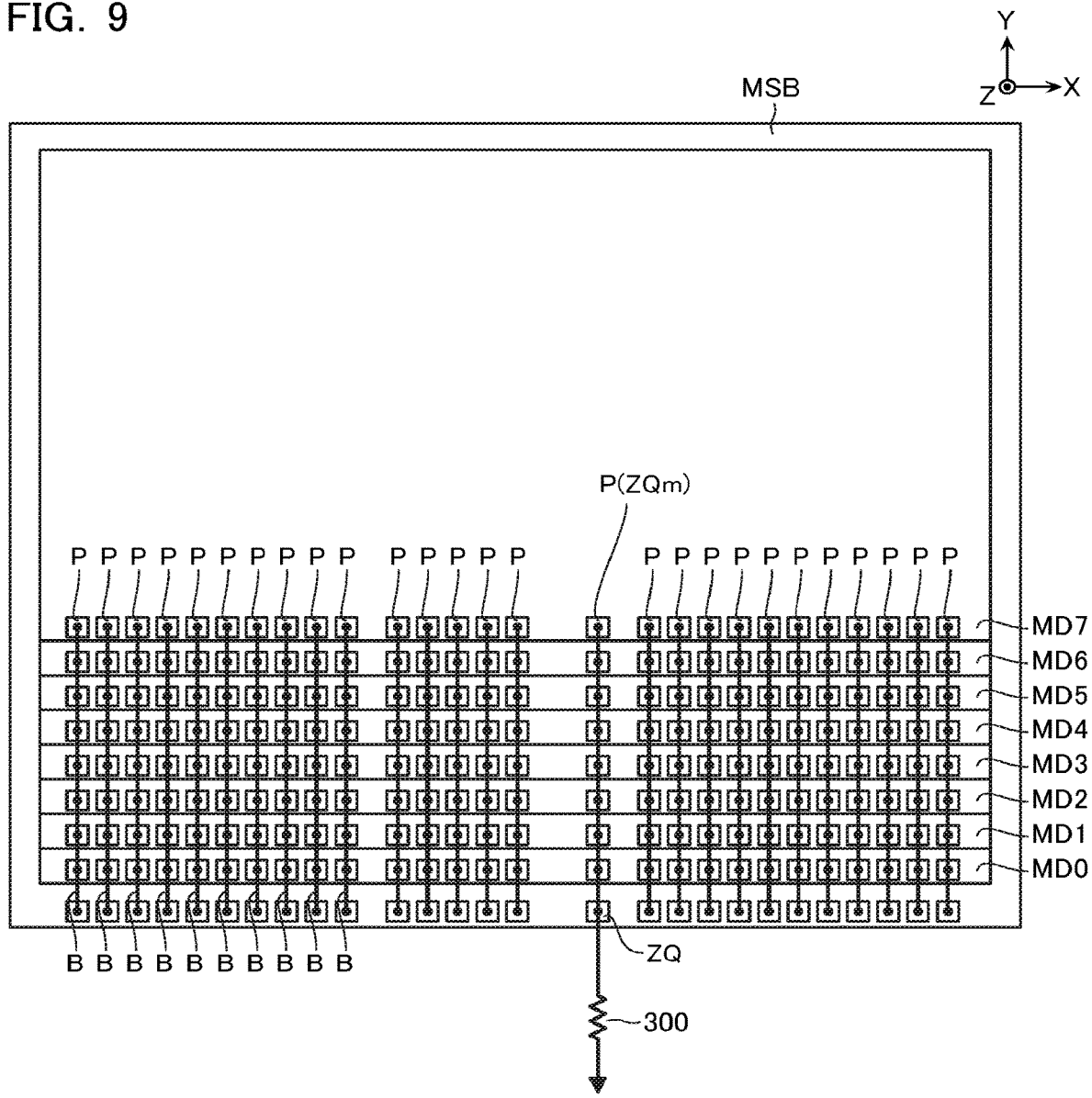
FIG. 9 is a schematic plan view illustrating a configuration of a semiconductor memory device according to a comparative example.

FIG. 9 is a schematic plan view illustrating a configuration of a semiconductor memory device according to a comparative example.

The semiconductor memory device according to the comparative example is basically configured similarly to the semiconductor memory device according to the first embodiment. However, in the semiconductor memory device according to the comparative example, the calibration electrodes ZQm of the memory dies MD0 to MD7 are all connected to the power supply voltage supply electrode VSS outside the semiconductor memory device via the calibration electrode ZQ of the mounting board MSB and the serial resistor 300 having a resistance value of approximately 240Ω. In the semiconductor memory device according to the comparative example, the calibration electrodes ZQs are not disposed in the memory dies MD0 to MD7.

A calibration operation of the semiconductor memory device according to the comparative example is basically performed similarly to the calibration operation of the semiconductor memory device according to the first embodiment. However, in the first embodiment, when the data PCODE<n:0> of the memory dies MD1 to MD7 is adjusted, the data NCODE<m:0> is output from the second replica unit control circuits 340 of the memory dies MD0 to MD6. On the other hand, in the comparative example, when the data PCODE<n:0> of the memory dies MD1 to MD7 is adjusted, the second replica unit control circuits 340 of the memory dies MD0 to MD6 cause the second replica unit 330 to be in the OFF state.

Effect

In association with the high integration of the semiconductor memory device, the number of the memory dies MD laminated on the mounting board MSB has been increasing. in association with this, a wiring length of the bonding wire B has also been increasing, and therefore, a wiring resistance of the bonding wire B is also getting increased.

Here, for example, when the data PCODE<n:0> of the memory die MD7 is adjusted in the semiconductor memory device according to the comparative example, the first replica unit control circuit 320 (FIG. 6) of the memory die MD7 is driven. This adjusts the data PCODE<n:0> such that the voltage of the calibration electrode ZQm approach the reference voltage.

Here, the calibration electrode ZQm of the memory die MD7 according to the comparative example is connected to the power supply voltage supply electrode VSS outside the semiconductor memory device via the bonding wire B and the serial resistor 300 having a resistance value of approximately 240Ω. The bonding wire B has a predetermined wiring resistance. Therefore, the impedance from the calibration electrode ZQm of the memory die MD7 to the power supply voltage supply electrode VSS outside the semiconductor memory device is larger than 240Ω.

Accordingly, adjusting the data PCODE<n:0> such that the voltage of the calibration electrode ZQm of the memory die MD7 according to the comparative example becomes the same extent as the reference voltage, in some cases increases the impedance when the pull-up circuit 311 is driven to be larger than 240Ω. In such a case, among the plurality of memory dies MD laminated on the mounting board MSB, one that are positioned on the upper side have high output impedance to possibly cause reduced driving force.

On the other hand, when the data PCODE<n:0> of the memory die MD7 is adjusted in the semiconductor memory device according to the first embodiment, the first replica unit control circuit 320 (FIG. 6) of the memory die MD7 is driven in a state where the data NCODE<m:0> is output from the second replica unit control circuit 340 of the memory die MD6. This adjusts the data PCODE<n:0> such that the voltage of the calibration electrode ZQm approach the reference voltage.

Here, the calibration electrode ZQm of the memory die MD7 according to the first embodiment is connected to the power supply voltage supply electrode VSS outside the semiconductor memory device via the bonding wire B, the pull-down circuit 332 of the second replica unit 330 of the memory die MD6, and the power supply voltage supply electrodes VSS of the memory die MD6. Here, the bonding wire B is connected only to the memory die MD7 and the memory die MD6, and the wiring resistance is smaller than that of the comparative example. The power supply voltage supply electrode VSS of the memory die MD6 is connected to the power supply voltage supply electrode VSS outside the semiconductor memory device via the plurality of bonding wires B, and therefore, the wiring resistance is small. Accordingly, the impedance from the calibration electrode ZQm of the memory die MD7 to the power supply voltage supply electrode VSS outside the semiconductor memory device is closer to 240Ω than that in the comparative example.

Accordingly, adjusting the data PCODE<n:0> such that the voltage of the calibration electrode ZQm of the memory die MD7 according to the first embodiment becomes the same extent as the reference voltage adjusts the impedance when the pull-up circuit 311 is driven to be approximately 240Ω. Accordingly, driving force of the memory dies MD laminated on the upper side can be restrained from being reduced, and thus, the semiconductor memory device that preferably operates can be provided.

Second Embodiment

Next, a semiconductor memory device according to the second embodiment will be described. Note that, in the following description, parts similar to those in the first embodiment are attached by reference numerals similar to those in the first embodiment, thereby omitting the description.

Overall Configuration

Figure 10:
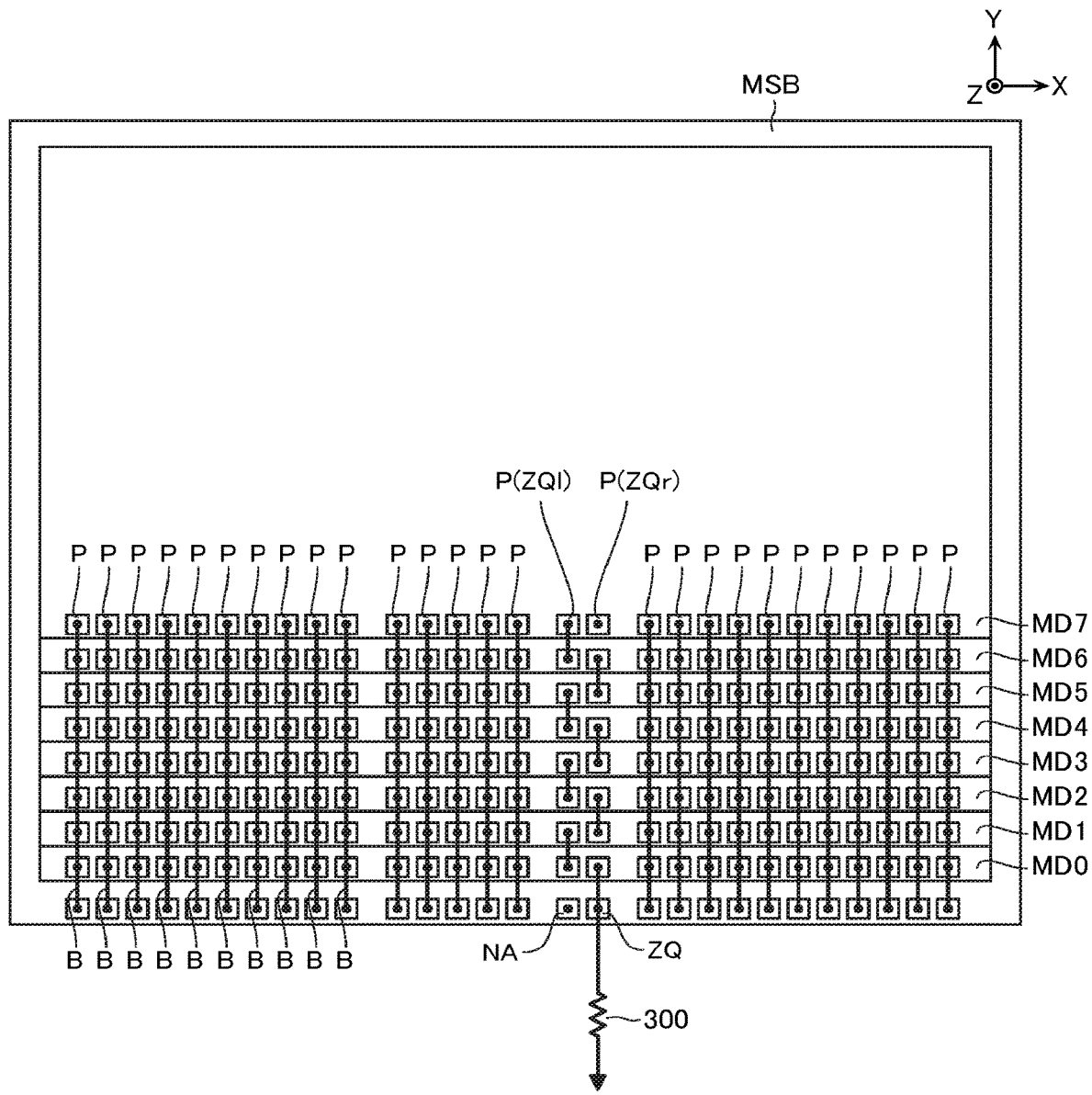
FIG. 10 is a schematic plan view illustrating a configuration of a semiconductor memory device according to a second embodiment.
Figure 11:
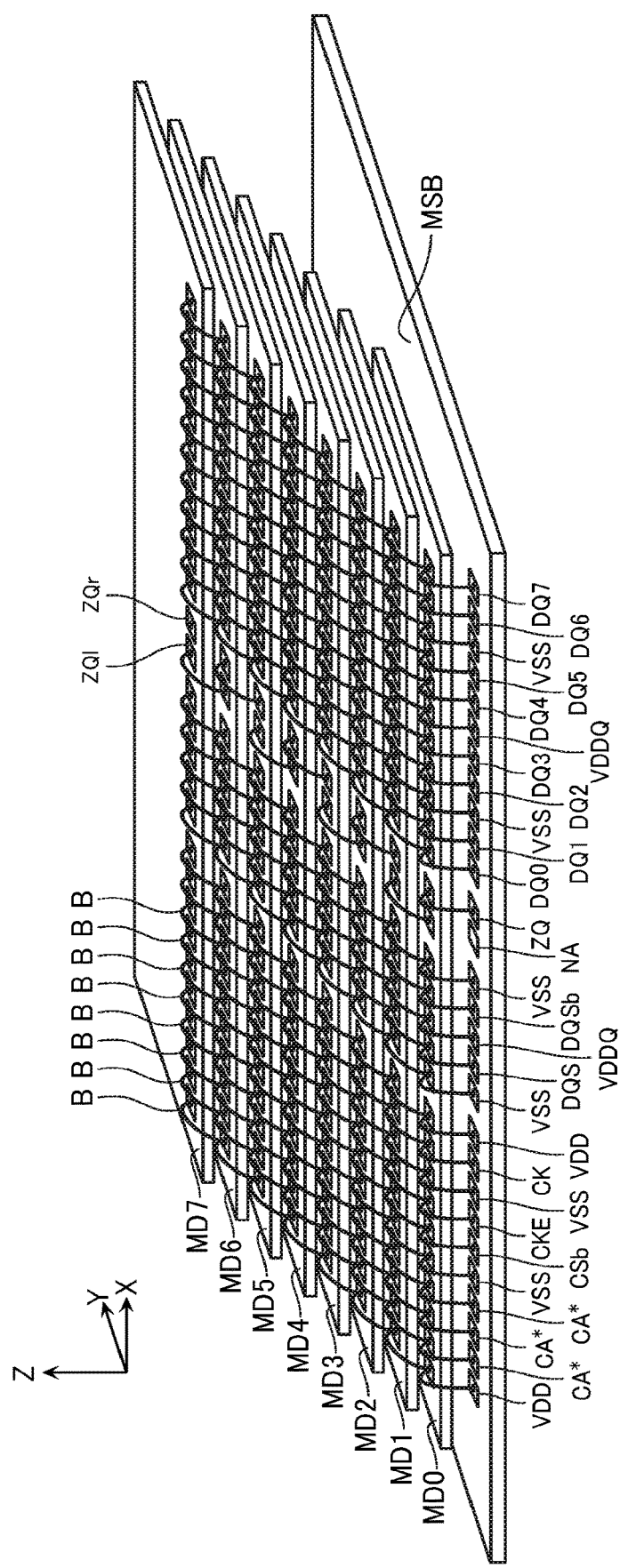
FIG. 11 is a schematic perspective view illustrating a configuration of the same semiconductor memory device.

FIG. 10 is a schematic plan view illustrating a configuration of the semiconductor memory device according to the second embodiment. FIG. 11 is a schematic perspective view illustrating the configuration of the same semiconductor memory device.

The semiconductor memory device according to the embodiment is basically configured similarly to the semiconductor memory device according to the first embodiment. However, in the semiconductor memory device according to the embodiment, the memory dies MD0 to MD7 each include calibration electrodes ZQr and ZQl, not the calibration electrodes ZQm or ZQs. In examples in FIG. 10 and FIG. 11, the calibration electrode ZQr is disposed in the right side of the calibration electrode ZQl. The calibration electrode ZQr of the memory die MD0 is connected to the calibration electrode ZQ of the mounting board MSB. The calibration electrodes ZQl of the memory dies MD1, MD3, MD5, and MD7 are connected to the calibration electrodes ZQl of the memory dies MD0, MD2, MD4, and MD6, respectively. The calibration electrodes ZQr of the memory dies MD2, MD4, and MD6, are connected to the calibration electrodes ZQr of the memory dies MD1, MD3, and MD5, respectively. The bonding wires B that connect the calibration electrodes ZQr and ZQl of the memory dies MD each extend in the Y direction viewing from the Z direction.

Calibration Circuits 17r and 17l

Figure 12:
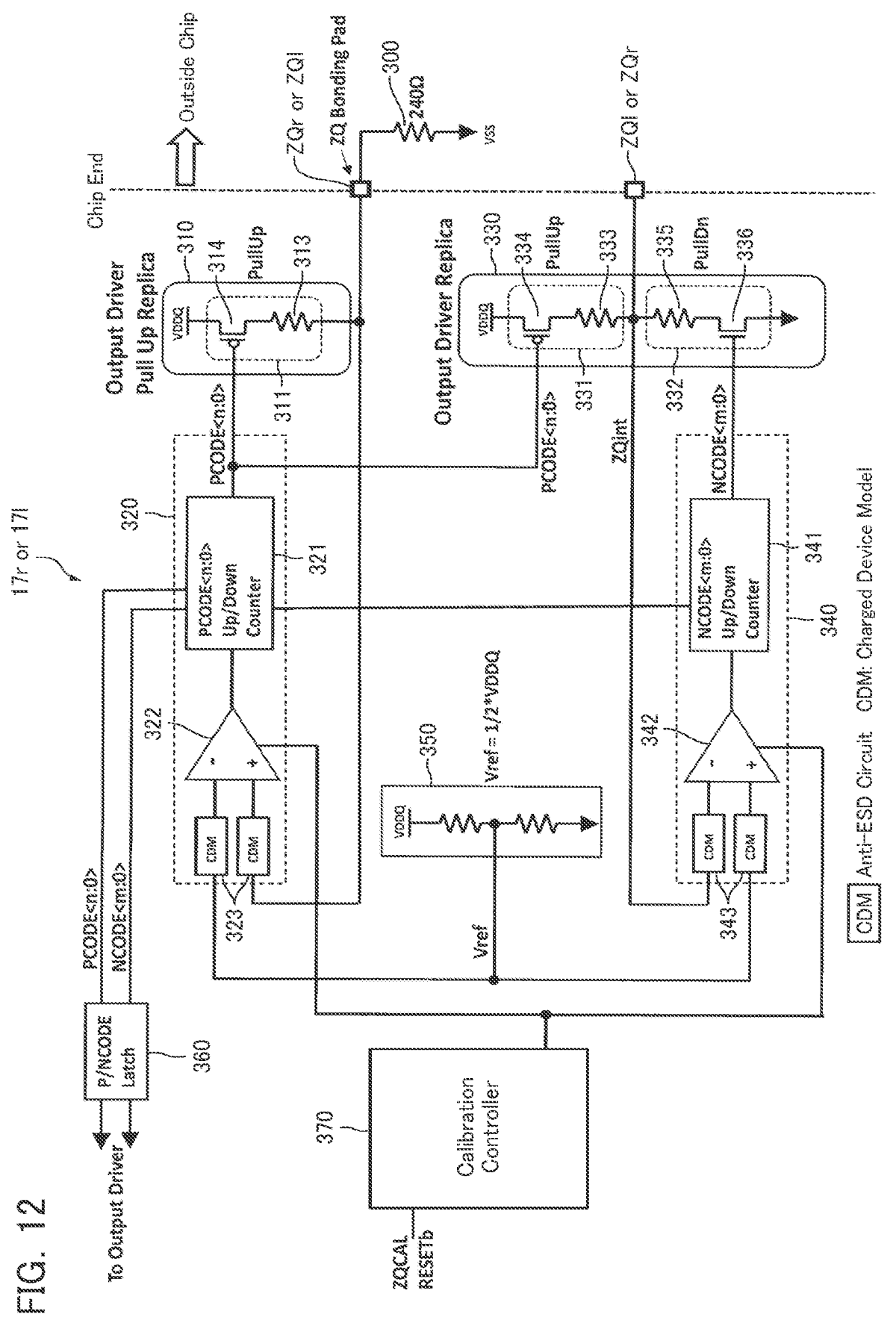

FIG. 12 is a schematic circuit diagram illustrating a configuration of calibration circuits 17r and 17l according to the embodiment.

The semiconductor memory device according to the embodiment includes the calibration circuit 17r connected to the calibration electrode ZQr and the calibration circuit 17l connected to the calibration electrode ZQl.

The calibration circuit 17r is basically configured similarly to the calibration circuit 17 according to the first embodiment. However, in the calibration circuit 17r, the first replica unit 310 and the first replica unit control circuit 320 are connected to the calibration electrode ZQr. The second replica unit 330 and the second replica unit control circuit 340 are connected to the calibration electrode ZQl.

The calibration circuit 17l is basically configured similarly to the calibration circuit 17 according to the first embodiment. However, in the calibration circuit 17l, the first replica unit 310 and the first replica unit control circuit 320 are connected to the calibration electrode ZQl. The second replica unit 330 and the second replica unit control circuit 340 are connected to the calibration electrode ZQr.

Calibration Operation

Figure 13:
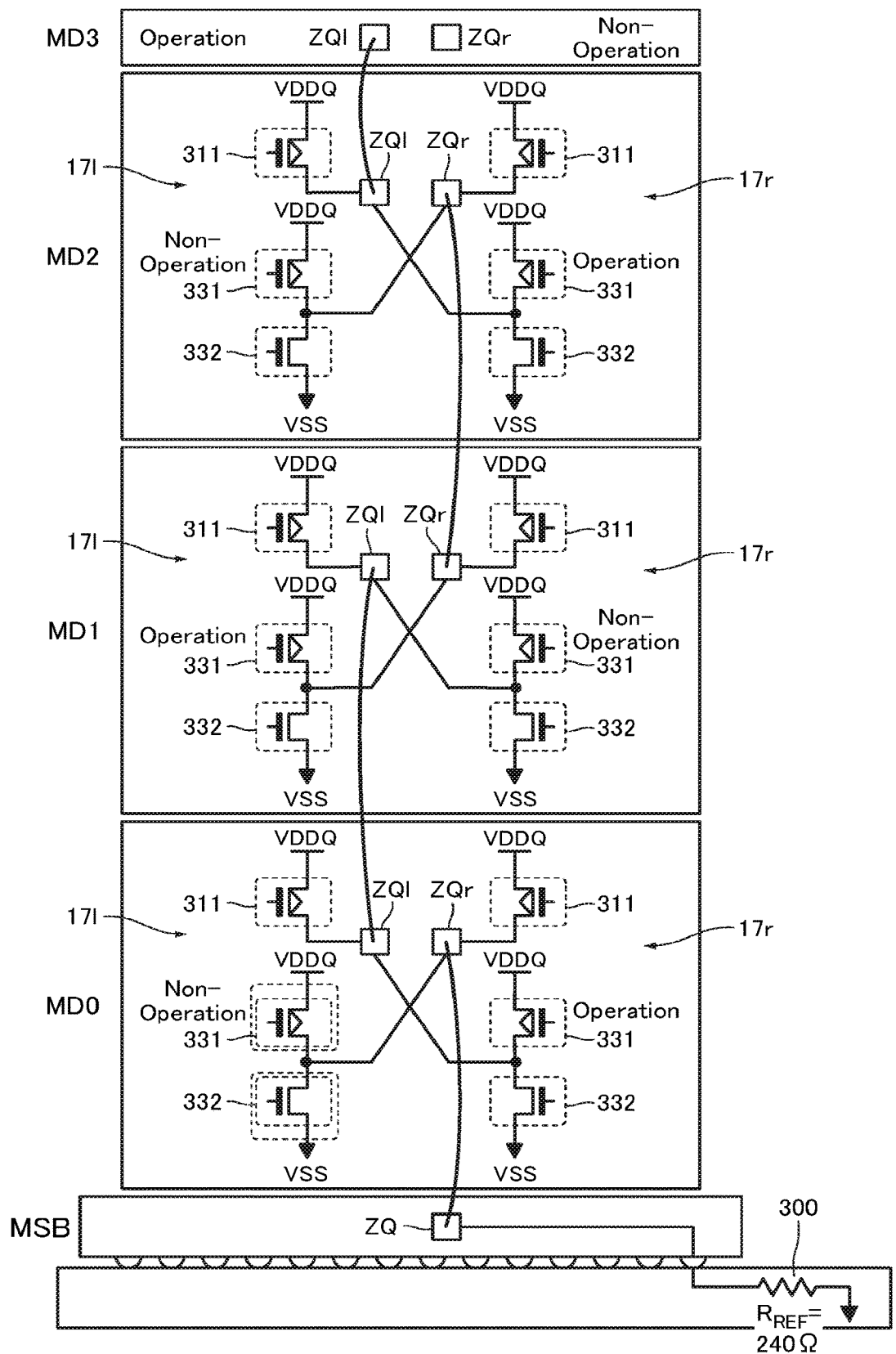
FIG. 13 is a schematic drawing for describing a calibration operation.

Next, with reference to FIG. 13, a calibration operation of the semiconductor memory device according to the embodiment will be described.

The calibration operation of the semiconductor memory device according to the embodiment is basically performed similarly to the calibration operation of the semiconductor memory device according to the first embodiment. However, in the calibration operation of the semiconductor memory device according to the embodiment, the calibration circuits 17r of the memory dies MD0, MD2, MD4, and MD6, and the calibration circuits 17l of the memory dies MD1, MD3, MD5, and MD7 function as the calibration circuits 17 of the respective memory dies MD0 to MD7 according to the first embodiment. Note that the calibration circuits 17l of the memory dies MD0, MD2, MD4, and MD6, and the calibration circuits 17r of the memory dies MD1, MD3, MD5, and MD7, are not used in the calibration operation.

Effect

As described with reference to FIG. 1 and the like, in the semiconductor memory device according to the first embodiment, the bonding wires B connected to the calibration electrodes ZQs of the memory dies MD0 to MD6 and the calibration electrodes ZQm of the memory dies MD1 to MD7 extend in the diagonal direction viewing from the Z direction. When such a configuration is employed, the number of manufacturing processes of the bonding wire B may be increased.

Meanwhile, as described with reference to FIG. 10 and the like, in the semiconductor memory device according to the second embodiment, both the bonding wire B connected to the calibration electrodes ZQr of the memory dies MD0 to MD6 and the bonding wire B connected to the calibration electrodes ZQl of the memory dies MD0 to MD7 extend in the Y direction viewing from the Z direction. When such a configuration is employed, the increase in the number of manufacturing processes of the bonding wire B may be able to be reduced.

Other Embodiments

The semiconductor memory device according to the embodiments have been described above. However, the description above is merely an example, and the above-described configuration, method, and the like are adjustable as necessary.

For example, the semiconductor memory device according to the above-described embodiment includes the mounting board MSB and the eight memory dies MD0 to MD7 laminated on this mounting board MSB. However, the number of the memory dies MD laminated on the mounting board MSB is adjustable as necessary. Similarly, for example, the numbers of the plurality of pad electrodes P disposed on the respective memory dies MD and the bonding wires B connected to the plurality of these pad electrodes P are also adjustable as necessary. For example, the number of the OCD units 210 included in the OCD circuit 15 is also adjustable as necessary.

In the above-described embodiment, the example where only the memory dies MD are laminated on the mounting board MSB has been described. However, a die other than the memory die MD may be laminated on the mounting board MSB. For example, a die of a controller that controls the memory die MD may be laminated on an upper side or a lower side of the memory die MD. In this case, the die of the controller may include the calibration electrodes ZQm and ZQs, or ZQr and ZQl similar to those of the memory die MD. The die of the controller may include the OCD circuit 15 and the calibration circuits 17, 17r, and 17l similar to those of the memory die MD.

In the above-described embodiment, the configuration where the data PCODE<n:0> is adjusted in each of the memory dies MD, and subsequently, the data NCODE<m:0> is adjusted based on the adjusted data PCODE<n:0> has been described. However, for example, it is possible to employ a configuration where the data NCODE<m:0> is adjusted in each of the memory dies MD, and subsequently, the data PCODE<n:0> is adjusted based on the adjusted data NCODE<m:0>. In such a case, for example, it is considered that a pull-down circuit is disposed instead of the pull-up circuit 311 in the first replica unit 310 in FIG. 6 such that the first replica unit control circuit 320 has a configuration to adjust the data NCODE<m:0> instead of the data PCODE<n:0>, and the second replica unit control circuit 340 has a configuration to adjust the data PCODE<n:0> instead of the data NCODE<m:0>.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a mounting board; and
a first and a second memory die mounted to the mounting board, wherein
the first and the second memory die each include:
a plurality of first pad electrodes usable for inputting/outputting data;
a plurality of first pull-up circuits connected to the plurality of first pad electrodes;
a first output circuit that outputs a first parameter to the plurality of first pull-up circuits;
a plurality of first pull-down circuits connected to the plurality of first pad electrodes;
a second output circuit that outputs a second parameter to the plurality of first pull-down circuits;
a second pad electrode;
a second pull-up circuit connected to the second pad electrode;
a third output circuit connected to the second pad electrode, the third output circuit outputting the first parameter to the second pull-up circuit;
a third pad electrode;
a second pull-down circuit connected to the third pad electrode; and
a fourth output circuit connected to the third pad electrode, the fourth output circuit outputting the second parameter to the second pull-down circuit, and
the second pad electrode of the second memory die is connected to the third ad electrode of the first memory die.

2. The semiconductor memory device according to claim 1, further comprising:
a third pull-up circuit connected to the third pad electrode; and
a fifth output circuit that outputs the first parameter to the third pull-up circuit.

3. The semiconductor memory device according to claim 1, wherein:
the third output circuit includes:
a first comparing circuit that outputs a signal indicating a magnitude relationship between a voltage of the second pad electrode and a first reference voltage; and
a first arithmetic circuit that adjusts the first parameter corresponding to an output signal of the first comparing circuit,
the fourth output circuit includes:
a second comparing circuit that outputs a signal indicating a magnitude relationship between a voltage of the third pad electrode and a second reference voltage; and
a second arithmetic circuit that adjusts the second parameter corresponding to an output signal of the second comparing circuit.

4. The semiconductor memory device according to claim 1, wherein when the first parameter and the second parameter are adjusted,
a voltage of the second pad electrode of the first memory die fluctuates from a first timing to a second timing,
voltages of the third pad electrode of the first memory die and the second pad electrode of the second memory die fluctuate from the first timing or a third timing to a fourth timing, and
a voltage of the third pad electrode of the second memory die fluctuates from a fifth timing after the second timing and the third timing to a sixth timing.

5. The semiconductor memory device according to claim 1, further comprising:
a plurality of first wirings connected to the plurality of first pad electrodes of the first memory die and the plurality of first pad electrodes of the second memory die; and
a second wiring connected to the third pad electrode of the first memory die and the second pad electrode of the second memory die, wherein
viewing from a laminating direction of the first and the second memory die,
the plurality of first wirings each extends in a first direction, and
the second wiring extends in a second direction intersecting with the first direction.

6. The semiconductor memory device according to claim 1, further comprising:
a plurality of first wirings connected to the plurality of first pad electrodes of the first memory die and the plurality of first pad electrodes of the second memory die; and
a second wiring connected to the third pad electrode of the first memory die and the second pad electrode of the second memory die, wherein
viewing from a laminating direction of the first and the second memory die,
the plurality of first wirings each extend in a first direction, and
the second wiring extend in the first direction.

7. The semiconductor memory device according to claim 1, further comprising:
a third memory die mounted to the mounting board, wherein
the third memory die includes:
the plurality of first pad electrodes;
the plurality of first pull-up circuits;
the first output circuit;
the plurality of first pull-down circuits;
the second output circuit;
the second pad electrode;
the second pull-up circuit;
the third output circuit;
the third pad electrode;
the second pull-down circuit; and
the fourth output circuit, and
the second pad electrode of the third memory die is connected to the third pad electrode of the second memory die.

8. The semiconductor memory device according to claim 7, further comprising:
a plurality of first wirings connected to the plurality of first pad electrodes of the first memory die, the plurality of first pad electrodes of the second memory die, and the plurality of first pad electrodes of the third memory die;
a second wiring connected to the third pad electrode of the first memory die and the second pad electrode of the second memory die; and
a third wiring connected to the third pad electrode of the second memory die and the second pad electrode of the third memory die, wherein
viewing from a laminating direction of the first to the third memory die,
the plurality of first wirings each extend in a first direction, and
the second wiring and the third wiring extend in a second direction intersecting with the first direction.

9. The semiconductor memory device according to claim 8, wherein
viewing from the laminating direction of the first to the third memory die,
the second pad electrode of the first to the third memory die align in one row in the first direction, and
the third pad electrode of the first to the third memory die align in one row in the first direction.

10. The semiconductor memory device according to claim 8, wherein
viewing from the laminating direction of the first to the third memory die, the second wiring and the third wiring align in the first direction.

11. The semiconductor memory device according to claim 7, further comprising:
a plurality of first wirings connected to the plurality of first pad electrodes of the first memory die, the plurality of first pad electrodes of the second memory die, and the plurality of first pad electrodes of the third memory die;
a second wiring connected to the third pad electrode of the first memory die and the second pad electrode of the second memory die; and
a third wiring connected to the third pad electrode of the second memory die and the second pad electrode of the third memory die, wherein
viewing from a laminating direction of the first to the third memory die,
the plurality of first wirings each extend in a first direction, and
the second wiring and the third wiring extend in the first direction.

12. The semiconductor memory device according to claim 11, wherein
viewing from the laminating direction of the first to the third memory die, the second pad electrode of the first memory die, the third pad electrode of the second memory die, and the second pad electrode of the third memory die align in one row in the first direction, and
the third pad electrode of the first memory die, the second pad electrode of the second memory die, and the third pad electrode of the third memory die align in one row in the first direction.

13. The semiconductor memory device according to claim 11, wherein
viewing from the laminating direction of the first to the third memory die, the second wiring and the third wiring have different positions in a third direction perpendicular to the first direction.

14. A semiconductor memory device comprising:
a mounting board; and
a first and a second memory die mounted to the mounting board, wherein
the first and the second memory die each include:

a plurality of first pad electrodes usable for inputting/
outputting data;
a second pad electrode;
a third pad electrode; and
an input/output control circuit connected to the plurality of first pad electrodes, the second pad electrode, and the third pad electrode, wherein
the second pad electrode of the second memory die is connected to the third pad electrode of the first memory die,
a voltage of the second pad electrode of the first memory die fluctuates from a first timing to a second timing,
voltages of the third pad electrode of the first memory die and the second pad electrode of the second memory die fluctuate from the first timing or a third timing to a fourth timing; and
a voltage of the third pad electrode of the second memory die fluctuates from a fifth timing after the second timing and the third timing to a sixth timing.

15. The semiconductor memory device according to claim 14, further comprising:
a plurality of first wirings connected to the plurality of first pad electrodes of the first memory die and the plurality of first pad electrodes of the second memory die; and
a second wiring connected to the third pad electrode of the first memory die and the second pad electrode of the second memory die, wherein
viewing from a laminating direction of the first and the second memory die,
the plurality of first wirings each extend in a first direction;
the second wiring extend in a second direction intersecting with the first direction.

16. The semiconductor memory device according to claim 14, further comprising:
a plurality of first wirings connected to the plurality of first pad electrodes of the first memory die and the plurality of first pad electrodes of the second memory die; and
a second wiring connected to the third pad electrode of the first memory die and the second pad electrode of the second memory die,
viewing from a laminating direction of the first and the second memory die,
the plurality of first wirings each extend in a first direction, and
the second wiring extends in the first direction.

* * * * *